United States Patent
Chien

(10) Patent No.: US 10,452,088 B1
(45) Date of Patent: Oct. 22, 2019

(54) SOURCE DRIVER AND OPERATION METHOD THEREOF

(71) Applicant: HIMAX TECHNOLOGIES LIMITED, Tainan (TW)

(72) Inventor: Chia-Chu Chien, Tainan (TW)

(73) Assignee: HIMAX TECHNOLOGIES LIMITED, Tainan (TW)

( * ) Notice: Subject to any disclaimer, the term of this patent is extended or adjusted under 35 U.S.C. 154(b) by 0 days.

(21) Appl. No.: 16/367,241

(22) Filed: Mar. 28, 2019

(51) Int. Cl.
*G05F 1/00* (2006.01)
*G05F 1/575* (2006.01)
*G05F 1/46* (2006.01)
*G05F 1/565* (2006.01)
*H03M 1/66* (2006.01)

(52) U.S. Cl.
CPC ............. *G05F 1/575* (2013.01); *G05F 1/468* (2013.01); *G05F 1/565* (2013.01); *H03M 1/66* (2013.01)

(58) Field of Classification Search
CPC .......... G05F 1/575; G05F 1/468; G05F 1/565; H03M 1/66
See application file for complete search history.

(56) References Cited

U.S. PATENT DOCUMENTS 9,413,310 B2 * 8/2016 Huang ................ H03F 3/217

* cited by examiner

*Primary Examiner* — Adolf D Berhane
*Assistant Examiner* — Afework S Demisse
(74) *Attorney, Agent, or Firm* — JCIPRNET

(57) ABSTRACT

A source driver and an operation method thereof are provided. The source driver includes an output buffer, a feedback switch, and a feedback voltage generating circuit. The output buffer receives the input voltage and produces an output voltage. The first terminal and the second terminal of the feedback switch are respectively coupled to the input terminal and the output terminal of the output buffer. During an overdrive period, the feedback switch is turned off, and the feedback voltage generating circuit outputs a feedback voltage to the output buffer. The feedback voltage is lower than the output voltage when the input voltage is in a rising mode. The feedback voltage is higher than the output voltage when the input voltage is in a falling mode. During a normal driving period, the feedback switch is turned on, and the feedback voltage generating circuit does not output the feedback voltage.

19 Claims, 7 Drawing Sheets

SOURCE DRIVER AND OPERATION METHOD THEREOF

BACKGROUND

Technical Field

The invention relates to a display device, and more particularly to a source driver and an operation method thereof.

Description of Related Art

Generally, a source driver is configured to drive a plurality of data lines (or source lines) of a display panel. The source driver is configured with a plurality of drive channel circuits. Each of the plurality of drive channel circuits drives a corresponding data line of the plurality of data lines by different output buffers. In the source driver, the output buffer may output an analog voltage of a digital to analog converter (DAC) to the data line of the display panel after gain. As the resolution of the display panel and/or the frame rate gets higher and higher, the charging time for a scan line gets shorter and shorter. To drive (charge or discharge) a pixel in a short period of time, the output butter needs to have enough drive ability. That is, the output butter needs to have enough slew rate. To enhance the slew rate, a tail current of the conventional output buffer is statically increased. The increase of the slew rate indicates the increase of power consumption.

SUMMARY

The invention provides a source driver and an operation method thereof. The output buffer selectively overdrives a pixel during a drive period to enhance a slew rate of an output voltage.

In an embodiment of the invention, a source driver is provided. The source driver includes an output buffer, a feedback switch, and a feedback voltage generating circuit. A first input terminal of the output buffer is configured to receive an input voltage. An output terminal of the output buffer is configured to generate the output voltage to a data line of a display panel. A first terminal and a second terminal of the feedback switch are respectively coupled to the second input terminal of the output buffer and the output terminal of the output buffer. During an overdrive period, the feedback switch is turned off, and the feedback voltage generating circuit generates and outputs the feedback voltage related to the output voltage to the second input terminal of the output buffer. When the input voltage is in a rising mode, the feedback voltage is lower than the output voltage, and when the input voltage is in a falling mode, the feedback voltage is higher than the output voltage. During a normal driving period, the feedback switch is turned on, and the feedback voltage generating circuit does not output the feedback voltage to the second input terminal of the output buffer.

In an embodiment of the invention, an operation method of the source driver is provided. The operation method includes the following. The first input terminal of the output buffer receives the input voltage, and the output terminal of the output buffer generates the output voltage to the data line of the display panel. The feedback switch is turned off during the overdrive period, where the first terminal and the second terminal of the feedback switch are respectively coupled to the second input terminal of the output buffer and the output terminal of the output buffer. During the overdrive period, the feedback voltage generating circuit generates and outputs the feedback voltage related to the output voltage to the second input terminal of the output buffer, where when the input voltage is in the rising mode, the feedback voltage is lower than the output voltage, and when the input voltage is in the falling mode, the feedback voltage is higher than output voltage. During the normal driving period, the feedback switch is turned on; and during the normal driving period, the feedback voltage generating circuit does not output the feedback voltage to the second input terminal of the output buffer.

In view of the foregoing, the embodiments of the source driver and the operation methods thereof of the invention may selectively alter the feedback voltage of the output buffer. The normal driving period and/or overdrive period may be included in a period of driving the pixel. The source driver may increase (or decrease) the feedback voltage. Therefore, the output buffer may selectively overdrive the data line of the display panel to enhance the slew rate of the output voltage.

To make the aforementioned and other features and advantages of the invention more comprehensible, several embodiments accompanied with figures are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EXEMPLARY EMBODIMENTS

Figure 1:
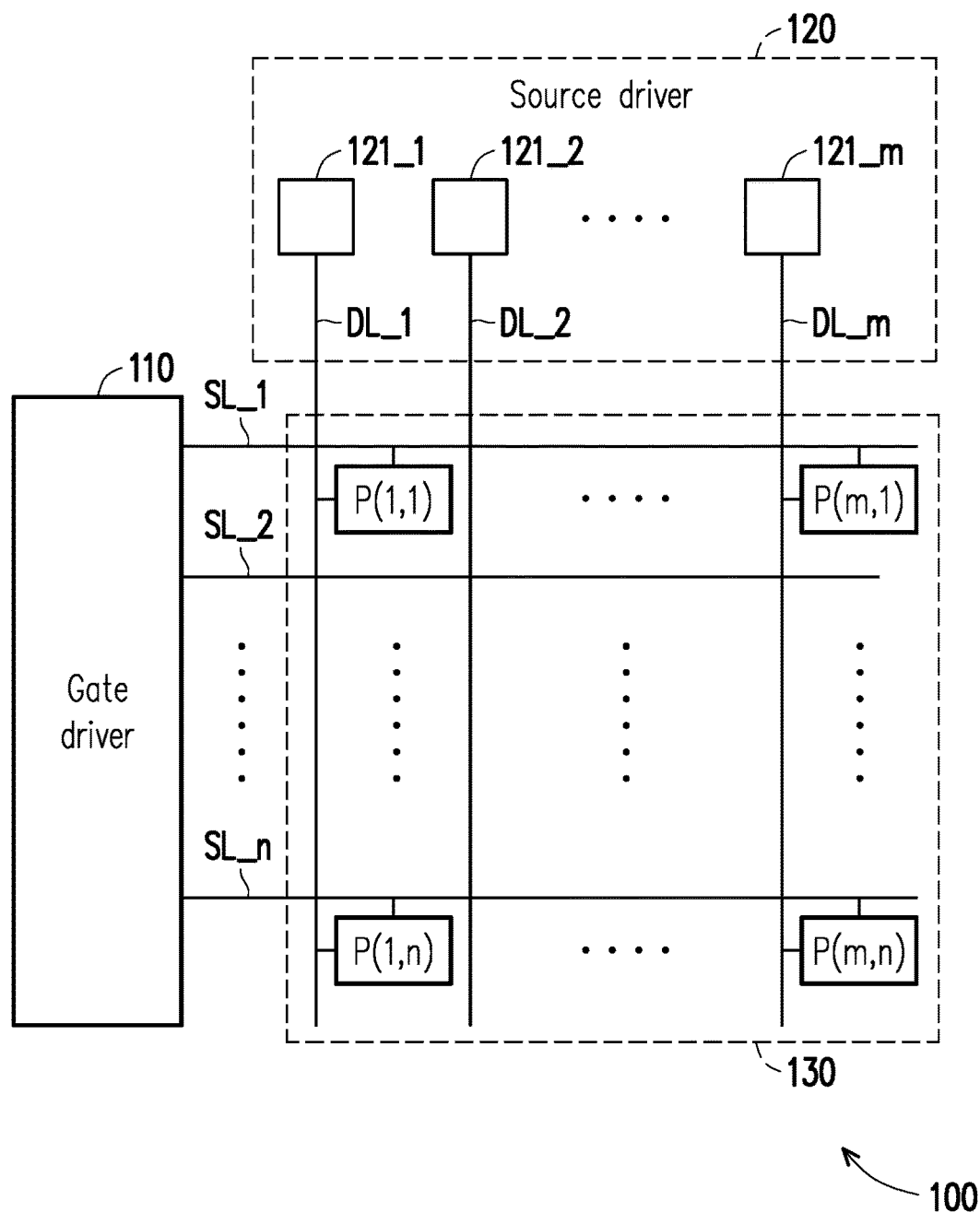
FIG. 1 is a circuit block schematic diagram of a display device according to an embodiment of the invention.

The term "couple (or connect)" used throughout this specification (including the claims) may refer to any direct or indirect connection means. For example, if it is described that the first device is coupled (or connected) to the second device, it should be understood that the first device may be directly connected to the second device or indirectly connected to the second device through other devices or certain connection means. Moreover, elements/components/steps with the same reference numerals represent the same or similar parts in the figures and embodiments where appropriate. Descriptions of the elements/components/steps with the same reference numerals or terms in different embodiments may be reference for one another.

FIG. 1 is a circuit block schematic diagram of a display device 100 according to an embodiment of the invention. The display device 100 illustrated in FIG. 1 includes a gate driver 110, a source driver 120 and a display panel 130. The display panel 130 may be any type of flat display panels, for example, a liquid display panel, an organic LED display panel, or any other display panels. The display panel 130 has a plurality of scan lines (also known as gate lines), a plurality of data lines (also known as source lines), and a plurality of pixel circuits. For example, as illustrated in FIG. 1, the plurality of scan lines includes n scan lines SL_1, SL_2, ..., SL_n. The plurality of data lines includes m data lines DL_1, DL_2, ..., DL_m, and the plurality of control circuits includes m*n control circuit P(1,1), ..., P(m,1), ..., P(1,n), ..., P(m,n), where m and n may be any integer determined based on design needs.

A plurality of output terminals of the gate driver 110 is coupled to different scan lines of the display panel 130 in a one-to-one manner. The gate driver 110 may scan/drive each of the scan lines of the display panel 130. The gate driver 110 may be any type of gate drivers. For example, based on design needs, the gate driver 110 may be a conventional gate driver or other gate drivers.

The source driver 120 has a plurality of drive channel circuits, for example, m drive channel circuits 121_1, 121_2, ..., 121_m as illustrated in FIG. 1. Output terminals of the drive channel circuits 121_1, 121_2, ..., 121_m are coupled to the display panel 130 in a one-to-one manner. The drive channel circuits 121_1, 121_2, ..., 121_m may convert digital pixel to corresponding output voltage (pixel voltage), and respectively output the output voltage to different data lines of the display panel 130. To match with scan timing of the gate driver 110, the source driver 120 may write the output voltage into the corresponding pixel circuit of the display panel 130 to display images by the data lines DL_1-DL_m.

Figure 2:
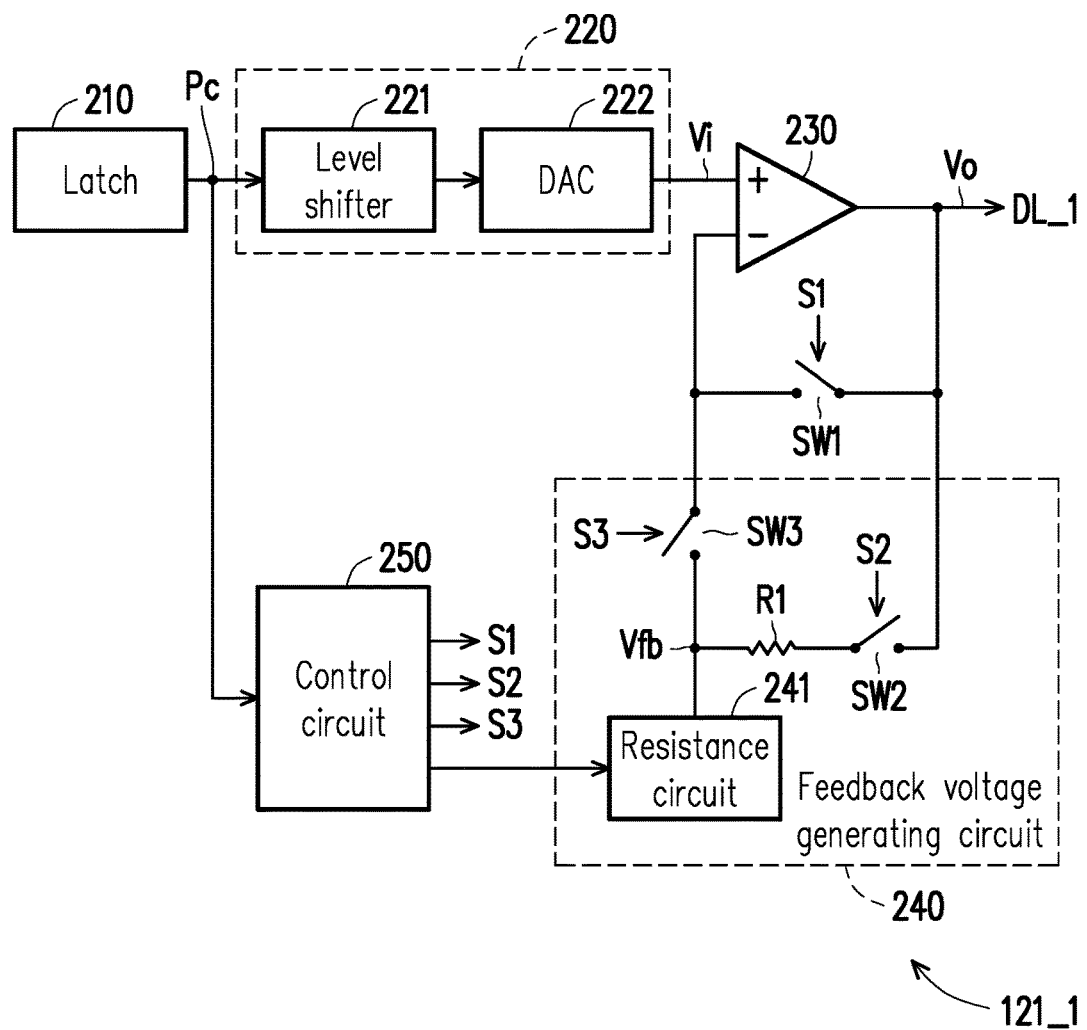
FIG. 2 is a circuit block schematic diagram of a source driver illustrated according to an embodiment of the invention.

FIG. 2 is a circuit block schematic diagram of a source driver illustrated according to an embodiment of the invention. A drive channel circuit 121_1 illustrated in FIG. 2 may be inferred from other drive channel circuits 121_1, 121_2, ..., 121_m illustrated in FIG. 1, and thus are not repeated hereinafter. The drive channel circuit 121_1 illustrated in FIG. 2 includes a latch 210, a conversion circuit 220, an output buffer 230, a feedback switch SW1, and a feedback voltage generating circuit 240. The latch 210 may provide a current pixel data Pc to the conversion circuit 220. The latch 210 may be any type of latches. For example, based on design needs, the latch 210 may be a conventional line latch or other latches.

The conversion 220 may convert the current pixel data Pc to analog voltage (hereinafter referred to as an input voltage Vi), and output the Vi to an output buffer 230. In the embodiment illustrated in FIG. 2, the conversion circuit 220 may include a level shifter 221 and a digital to analog converter (DAC) 222. The level shifter 221 may increase a voltage swing of the current pixel data Pc, while the DAC 222 may convert the current pixel data to the input voltage Vi. The DAC may output the input voltage Vi to the output buffer 230. In other embodiments, the level shifter 221 may be omitted because of design needs, so that the DAC 222 may directly receive the current pixel data Pc.

The output buffer 230 may be any type of output buffers, amplifying circuits, or gain circuits. For example, based on design needs, the output buffer 230 may include conventional operation amplifiers or other amplifiers. A first input terminal of the output buffer 230 (e.g., a non-inverse input terminal) is coupled to an output terminal of the DAC 222 to receive the input voltage Vi. An output terminal of the output buffer 230 may generate an output voltage Vo to the data line DL_1 of the display panel 130.

Based on the needs of an applied environment, a control circuit 250 may selectively divide a scan line period (a period that a pixel circuit is turned on) into an overdrive period and a normal driving period. Based on the control of the control circuit 250 on the feedback switch SW1 and the feedback voltage generating circuit 240, the output buffer 230 may overdrive the data line DL_1 during the overdrive period, while perform normal drive on the data line DL_1 during the normal driving period. The output buffer 230 may overdrive the data line DL_1 during the overdrive period to enhance the slew rate of the voltage Vo. Accordingly, an electric parameter inside the output buffer 230, such as a tail current, is not required to be adjusted/changed to promote the slew rate.

Based on the needs of applied environment, the control circuit 250 may also selectively treat a scan line period (a period that a pixel circuit is turned on) as normal driving periods. That is, the overdrive operation performed by the output buffer 230 on the data line DL_1 may selectively be disabled.

Regarding the time span of the overdrive period, it may be selectively configured based on the needs of applied environment. In the embodiment illustrated in FIG. 1, the data line DL_1 is coupled to a near pixel circuit (e.g., a pixel circuit P (1,1)) and a far pixel circuit (e.g., a pixel circuit P(1,n)) of the display panel 130. The distance from the near pixel circuit to the source driver 120 is smaller than the distance from the far pixel circuit to the source driver 120. Generally, the time constant of the far pixel circuit is greater than the time constant of the near pixel circuit. Based on design needs, the control circuit 250 may dynamically adjust the time span of the overdrive period according to the position of the pixel circuit in the display panel 130 (the distance from the pixel circuit to the source driver 120). For example, the time span of the overdrive period related to the near pixel circuit is shorter than the time span of the overdrive period related to the far pixel circuit.

A first terminal and a second terminal of the feedback switch SW1 are respectively coupled to a second input terminal of the output buffer 230 (e.g., an inverse input terminal) and the output terminal of the output buffer 230. The feedback switch SW1 is controlled by a control signal 51 of the control circuit 250. The control circuit 250 turns off the feedback switch SW1 during the overdrive period and turns on the feedback switch SW1 during the normal driving period. When the feedback switch SW1 is turned on, the output buffer 230 is equivalent to a unity-gain buffer. At this time, the output voltage Vo is configured as the feedback voltage and is fed back to the second input terminal of the output buffer 230. Therefore, the output voltage Vo may follow the input voltage Vi.

The feedback voltage generating circuit 240 is coupled to the output buffer 230. During the overdrive period, the feedback voltage generating circuit 240 may generate and output a feedback voltage Vfb related to the output voltage Vo to the second input terminal of the output buffer 230. When the input voltage Vi is "in a rising mode", the feedback voltage Vfb is lower than the output voltage Vo. When the input voltage Vi is "in a falling mode", the feedback voltage Vfb is higher than the output voltage Vo.

Hence, the output buffer 230 may overdrive the data line DL_1 of the display panel 130 during the overdrive period to enhance the slew rate of the output voltage Vo. During the normal driving period, the feedback voltage generating circuit 240 may not output the output feedback voltage Vfb to the second input terminal of the output buffer 230. That is, the feedback voltage generating circuit 240 may not interfere the second input terminal of the output buffer 230 during the normal driving period.

In the embodiment as illustrated in FIG. 2, "the input voltage Vi is in the rising mode" may be defined as "the input voltage Vi corresponding to the current pixel data Pc is greater than the input voltage Vi corresponding to prior pixel data," and "the input voltage Vi is in a falling mode" may be defined as "the input voltage Vi corresponding to the current pixel data Pc is smaller than the input voltage Vi corresponding to the prior pixel data". The prior pixel data may be understood as the pixel data during a prior scan line period. Conversely, the current pixel data Pc is the pixel data in the current scan line period. The control circuit 250 may check the current pixel data Pc and the prior pixel data to determine whether the input voltage Vi to be risen or be fallen.

When the current pixel data Pc is greater than the prior pixel data and the drive channel circuits 121_1 operates in a positive polarity, the control circuit 250 may be determined as "the input voltage Vi is to be risen". Alternatively, when the current pixel data Pc is smaller than the prior pixel data and the drive channel circuits 121_1 operates in a negative polarity, the control circuit 250 may be determined as "the input voltage Vi is to be risen". That is, the input voltage Vi is in the rising mode. When the input voltage Vi is in the rising mode, the control circuit 250 controls the feedback voltage generating circuit 240, so that the feedback voltage Vfb is lower than the output voltage Vo. The feedback voltage Vfb is supplied to the second input terminal of the output buffer 230 during the overdrive period (at this time, the feedback switch SW1 is turned off). Therefore, the output voltage Vo may be higher than a target level during the overdrive period. The target level may be compliant with a level of the input voltage Vi. The feedback voltage Vfb is not supplied to the second input terminal of the output buffer 230 during the normal driving period (at this time, the feedback switch SW1 is turned on). Therefore, the output voltage Vo may return to the target level (for example, the level of the input voltage Vi) during the normal driving period.

When the current pixel data Pc is smaller than the prior pixel data and the drive channel circuits 121_1 operates in the positive polarity, the control circuit 250 may determine "the input voltage Vi is to be fallen." Alternatively, when the current pixel data Pc is greater than the prior pixel data and the drive channel circuits 121_1 operates in the negative polarity, the control circuit 250 may be determined as "the input voltage Vi is to be fallen". That is, the input voltage Vi is in the falling mode. When the input voltage Vi is in the falling mode, the control circuit 250 controls the feedback voltage generating circuit 240, so that the feedback voltage Vfb is higher than the output voltage Vo. The feedback voltage Vfb is supplied to the second input terminal of the output buffer 230 during the overdrive period (at this time, the feedback switch SW1 is turned off). Therefore, the output voltage Vo may be lower than the target level during the overdrive period. The target level may be compliant with a level of the input voltage Vi. The feedback voltage Vfb may not be supplied to the second input terminal of the output buffer 230 during the normal driving period (at this time, the feedback switch SW1 is turned on). Therefore, the output voltage Vo may return to the target level (for example, the level of the input voltage Vi) during the normal driving period.

In the embodiment as illustrated in FIG. 2, the feedback voltage generating circuit 240 includes a switch SW2, a switch SW3, a voltage-dividing resistor R1, and a resistance circuit 241. The switch SW2 is controlled by a control signal S2 of the control circuit 250, and the switch SW3 is controlled by a control signal S3 of the control circuit 250. During the overdrive period, the control circuit 250 turn on the switch SW2 and the switch SW3. During the normal driving period, the control circuit 250 turn off the switch SW2 and the switch SW3. A first terminal of the switch SW2 is coupled to the output terminal of the output buffer 230. A first terminal of the switch SW3 is coupled to the second input terminal of the output buffer 230.

A first terminal of the first voltage-dividing resistor R1 is coupled to a second terminal of the switch SW2. A second terminal of the first voltage-dividing resistor R1 is coupled to a second terminal of the switch SW3. The resistance circuit 241 is coupled to the second terminal of the first voltage-dividing resistor R1 to supply resistance. The voltage-dividing resistor R1 and the resistance circuit 241 may be operated by dividing voltage to generate the feedback voltage Vfb related to the output voltage Vo. When the input voltage Vi is in the rising mode, the control circuit 250 controls the resistance circuit 241, so that the feedback voltage Vfb is lower than the output voltage Vo. The feedback voltage Vfb is supplied to the second input terminal of the output buffer 230 by the switch SW3 during the overdrive period (at this time, the feedback switch SW1 is turned off). Therefore, the output voltage Vo may be higher than the target level during the overdrive period. When the input voltage Vi is in a falling mode, the control circuit 250 controls the resistance circuit 241, so that the feedback voltage Vfb is higher than the output voltage Vo. The feedback voltage Vfb is supplied to the second input terminal of the output buffer 230 by the switch SW3 during the overdrive period (at this time, the feedback switch SW1 is turned off). Therefore, the output voltage Vo may be lower than the target level during the overdrive period. The feedback voltage Vfb is not supplied to the second input terminal of the output buffer 230 during the normal driving period (at this time, the feedback switch SW1 is turned on). Therefore, the output voltage Vo may return to the target level (for example, the level of the input voltage Vi) during the normal driving period.

Figure 3:
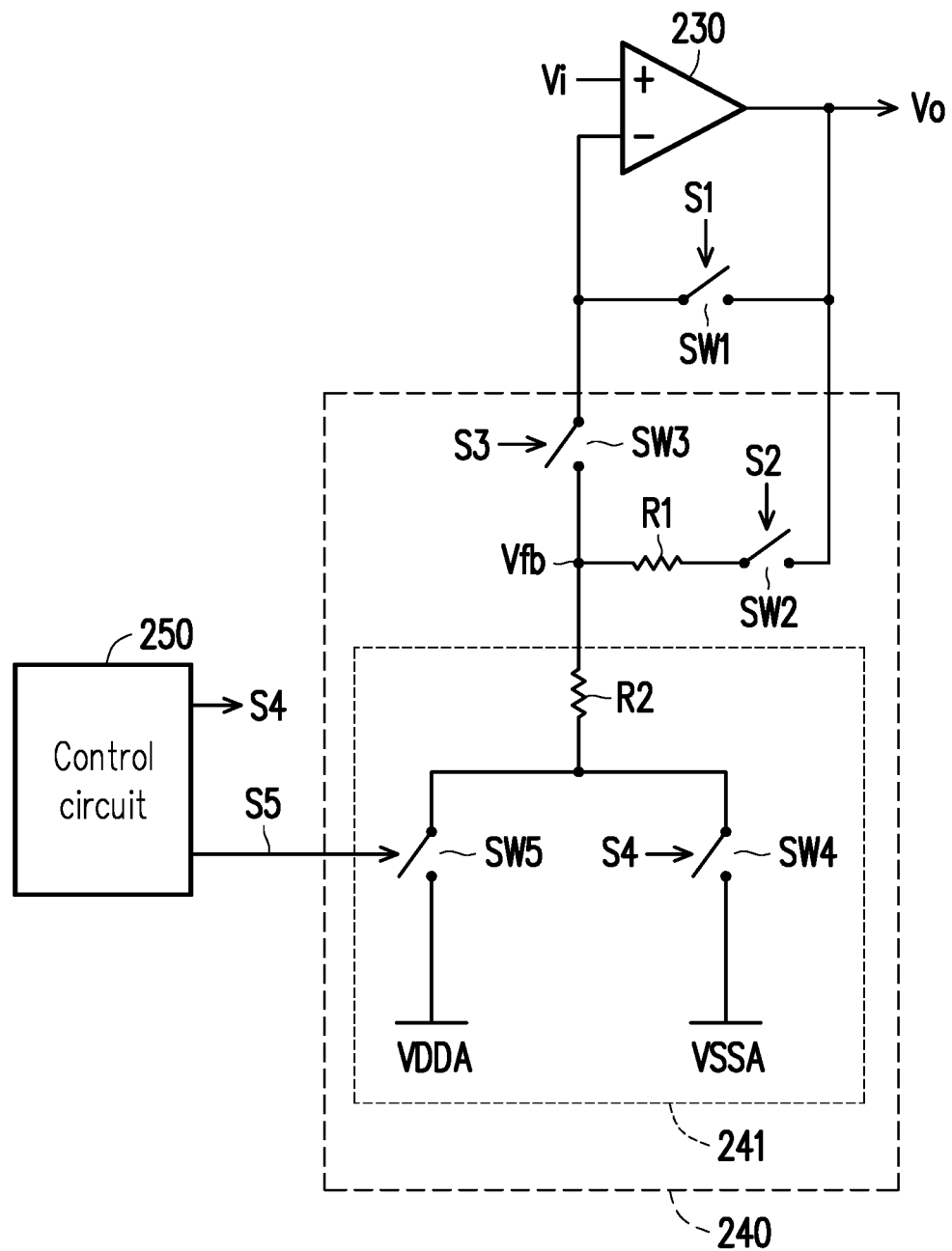
FIG. 3 is a circuit block schematic diagram of a resistance circuit illustrated in FIG. 2 according to an embodiment of the invention.

FIG. 3 is a circuit block schematic diagram of a resistance circuit illustrated in FIG. 2 according to an embodiment of the invention. In the embodiment illustrated in FIG. 3, the resistance circuit 241 includes a voltage-dividing resistor R2 and a switch SW4, and a switch SW5. A first terminal of the voltage-dividing resistor R2 is coupled to a second terminal of the voltage-dividing resistor R1. The resistance ratio of the voltage-dividing resistor R1 and the voltage-dividing resistor R2 may be determined based on design needs. The voltage-dividing resistor R1 and voltage-dividing resistor R2 may be operated by dividing voltage to generate the feedback voltage Vfb related to the output voltage Vo.

A first terminal of the switch SW4 and a first terminal of the switch SW5 are both coupled to a second terminal of the voltage-dividing resistor R2. A second terminal of the switch SW4 is coupled to a reference voltage VSSA. Based on design needs, the reference voltage VSSA may be any voltage lower than the output voltage Vo, for example, a ground voltage or other fixed voltages. A second terminal of the switch SW5 is coupled to a system voltage VDDA. Based on design needs, the system voltage VDDA may be any voltage higher than the output voltage Vo. The switch SW4 is controlled by a control signal S4 of the control circuit 250, whereas the switch SW5 is controlled by a control signal S5 of the control circuit 250. When the input voltage Vi is in the rising mode, the control circuit 250 turns on the switch SW4 and turns off the switch SW5. When the input voltage Vi is in a falling mode, the control circuit 250 turns off the switch SW4 and turns on the switch SW5.

Figure 4:
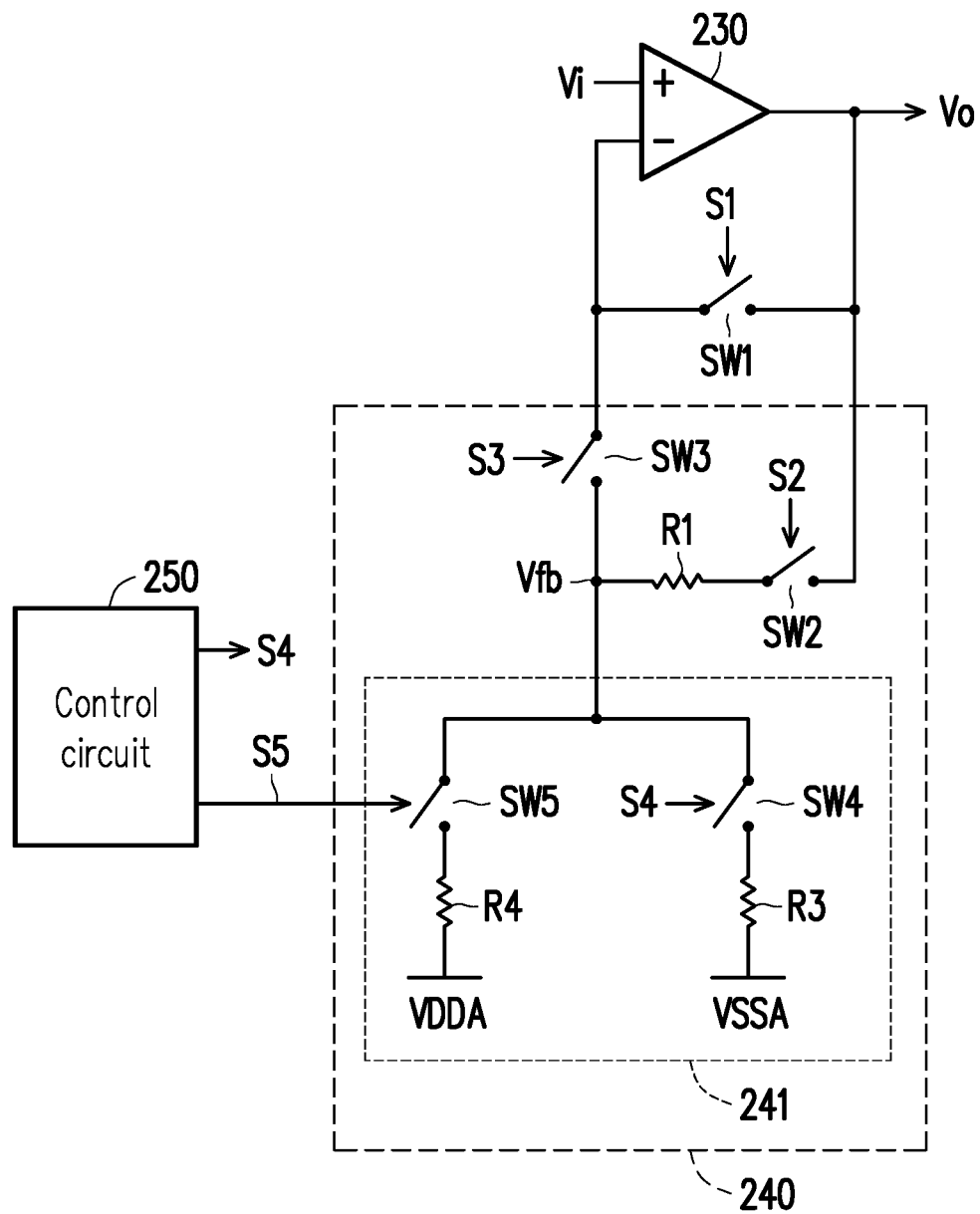
FIG. 4 is a circuit block schematic diagram of a resistance circuit illustrated in FIG. 2 according to another embodiment of the invention.

FIG. 4 is a circuit block schematic diagram of a resistance circuit illustrated in FIG. 2 according to another embodiment of the invention. In the embodiment illustrated in FIG. 4, the resistance circuit 241 includes a voltage-dividing resistor R3, a voltage-dividing resistor R4, the switch SW4, and the switch SW5. The first terminal of the switch SW4 is coupled to the second terminal of the voltage-dividing resistor R1. A first terminal of the voltage-dividing resistor R3 is coupled to the second terminal of the switch SW4. A second terminal of the voltage-dividing resistor R3 is coupled to the reference voltage VSSA. Based on design needs, the reference voltage VSSA may be any voltage lower than the output voltage Vo, for example, the ground voltage or the other fixed voltages. The switch SW4 is controlled by the control signal S4 of the control circuit 250. When the input voltage Vi is in the rising mode, the control circuit 250 turns on the switch SW4. When the input voltage Vi is in the falling mode, the control circuit 250 turns off the switch SW4.

The first terminal of the switch SW5 is coupled to the second terminal of the voltage-dividing resistor R1. A first terminal of the voltage-dividing resistor R4 is coupled to the second terminal of the switch SW5. A second terminal of the voltage-dividing resistor R4 is coupled to the system voltage VDDA. Based on design needs, the system voltage VDDA may be any voltage higher than the output voltage Vo. The switch SW5 is controlled by the control signal S5 of the control circuit 250. When the input voltage Vi is in the rising mode, the control circuit 250 turns off the switch SW5. When the input voltage Vi is in the falling mode, the control circuit 250 turns on the switch SW5.

The resistance value of the voltage-dividing resistor R3 and the resistance value of the voltage-dividing resistor R4 may be determined based on design needs. For instance, the resistance value of the voltage-dividing resistor R3 may be different from the resistance value of the voltage-dividing resistor R4. Therefore, when the input voltage Vi is in the rising mode, a first resistance value ratio may be provided by the voltage-dividing resistor R1 and the voltage-dividing resistor R3. When the input voltage Vi is in the falling mode, a second resistance value ratio may be provided by the voltage-dividing resistor R1 and the voltage-dividing resistor R4, where the second resistance value ratio may be different from the first resistance value ratio.

Figure 5:
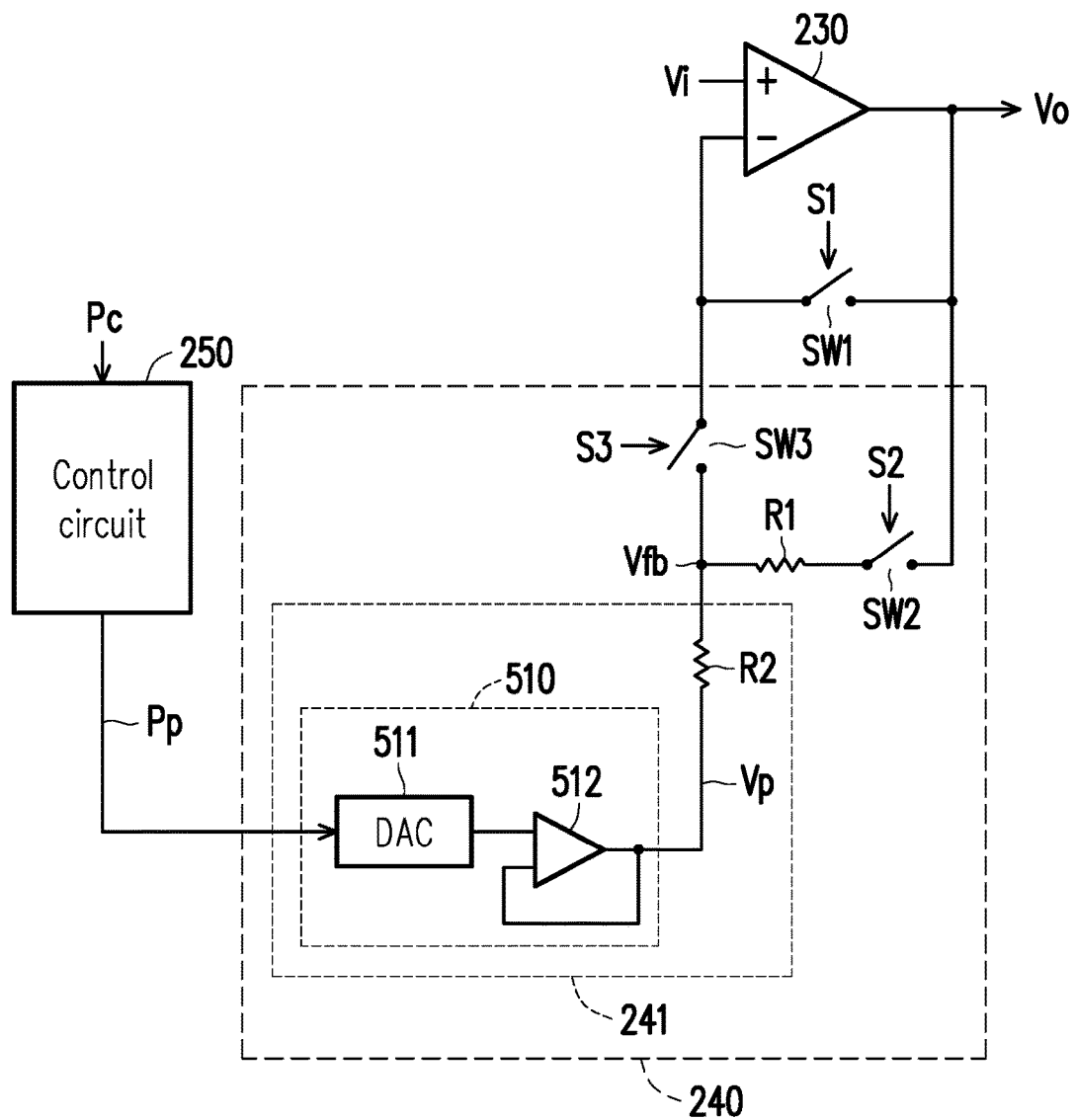
FIG. 5 is a circuit block schematic diagram of a resistance circuit illustrated in FIG. 2 according to yet another embodiment of the invention.

FIG. 5 is a circuit block schematic diagram of a resistance circuit illustrated in FIG. 2 according to yet another embodiment of the invention. In the embodiment illustrated in FIG. 5, the resistance circuit 241 includes the voltage-dividing resistor R2 and a digital to analog circuit 510. The first terminal of the voltage-dividing resistor R2 is coupled to the second terminal of the voltage-dividing resistor R1. The voltage-dividing resistor R2 illustrated in FIG. 5 may be inferred with reference to the related descriptions of the voltage-dividing resistor R2 illustrated in FIG. 3, and thus are not repeated hereinafter.

The control circuit 250 may record the current pixel data Pc during a prior scan line period as a prior pixel data Pp. An input terminal of the digital to analog circuit 510 is coupled to the control circuit 250 to receive the prior pixel data Pp. An output terminal of the digital to analog circuit 510 is coupled to the second terminal of the voltage-dividing resistor R2. The digital to analog circuit 510 may convert the prior pixel data Pp to a prior voltage Vp. The digital to analog circuit 510 may output the prior voltage Vp to the second terminal of the voltage-dividing resistor R2. When the current pixel data Pc is greater than the prior pixel data Pp and the drive channel circuits 121_1 operates in the positive polarity, the input voltage Vi related to the current pixel data Pc is greater than the prior voltage Vp of the prior pixel data Pp, so that the feedback voltage Vfb is lower than the output voltage Vo. When the current pixel data Pc is smaller than the prior pixel data Pp and the drive channel circuits 121_1 operates in the positive polarity, the input voltage Vi related to the current pixel data Pc is smaller than the prior voltage Vp of the prior pixel data Pp, so that the feedback voltage Vfb is higher than the output voltage Vo.

When the current pixel data Pc is smaller than the prior pixel data Pp and the drive channel circuits 121_1 operates in the negative polarity, the input voltage Vi related to the current pixel data Pc is greater than the prior voltage Vp of the prior pixel data Pp, so that the feedback voltage Vfb is lower than the output voltage Vo. When the current pixel data Pc is greater than the prior pixel data Pp and the drive channel circuits 121_1 operates in the negative polarity, the input voltage Vi related to the current pixel data Pc is smaller than the prior voltage Vp of the prior pixel data Pp, so that the feedback voltage Vfb is higher than the output voltage Vo.

In the embodiment illustrated in FIG. 5, the digital to analog circuit 510 includes a DAC 511 and a unity-gain buffer 512. An input terminal of the DAC 511 is coupled to the control circuit 250 to receive the prior pixel data Pp. An input terminal of the unity-gain buffer 512 is coupled to an output terminal of the DAC 511. An output terminal of the unity-gain buffer 512 is coupled to the second terminal of the voltage-dividing resistor R2 to supply the prior voltage Vp. The digital to analog circuit 510 can dynamically change the prior voltage Vp in accordance with the prior pixel data Pp. In other embodiments, the digital to analog circuit circuit 510 can freely set the prior voltage Vp to the system voltage VDDA, the reference voltage VSSA, or any other voltage.

Figure 6:
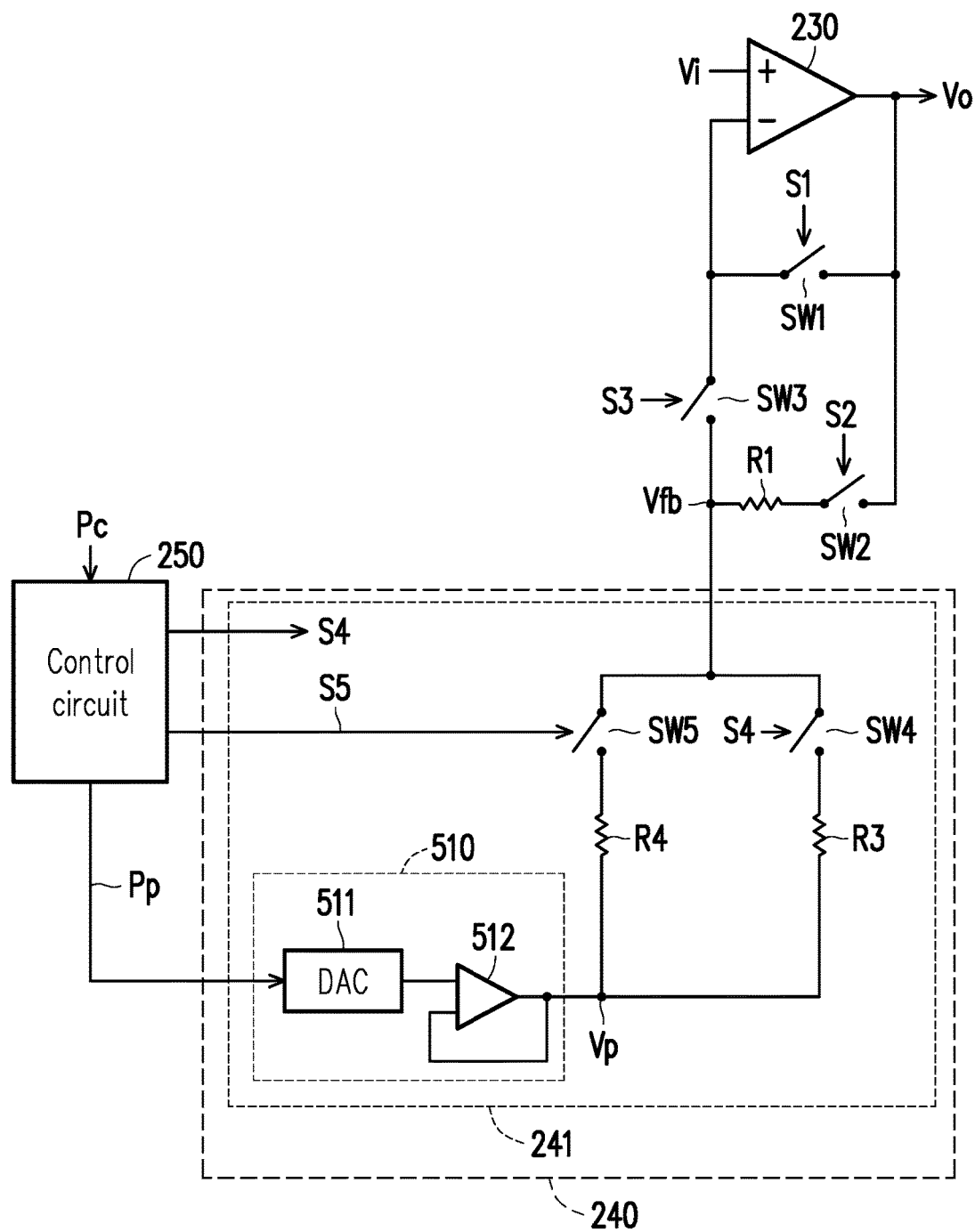
FIG. 6 is a circuit block schematic diagram of a resistance circuit illustrated in FIG. 2 according to still another embodiment of the invention.

FIG. 6 is a circuit block schematic diagram of a resistance circuit illustrated in FIG. 2 according to still another embodiment of the invention. In the embodiment illustrated in FIG. 6, the resistance circuit 241 includes the voltage-dividing resistor R3, the voltage-dividing resistor R4, the switch SW4, the switch SW5, and the digital to analog circuit 510. The voltage-dividing resistor R3, the voltage-dividing resistor R4, the switch SW4, and the switch SW5 illustrated in FIG. 6 may be inferred with reference to the related descriptions of the voltage-dividing resistor R3, the voltage-dividing resistor R4, the switch SW4, and the switch SW5 as illustrated in FIG. 4, and thus are not repeated hereinafter.

The first terminal of the voltage-dividing resistor R3 is coupled to the second terminal of the switch SW4. The first terminal of the voltage-dividing resistor R4 is coupled to the second terminal of the switch SW5. The output terminal of the digital to analog circuit 510 is coupled to the second terminal of the voltage-dividing resistor R3 and the second terminal of the voltage-dividing resistor R4. The digital to analog circuit 510 may convert the prior pixel data Pp to the prior voltage Vp. The digital to analog circuit 510 may output the prior voltage Vp to the second terminal of the voltage-dividing resistor R3 and the second terminal of the voltage-dividing resistor R4. The digital to analog circuit 510 illustrated in FIG. 6 may be inferred with reference to the related descriptions of the digital to analog circuit 510 as illustrated in FIG. 5, and thus are not repeated hereinafter.

Based on different design needs, the implementation of the block of the aforementioned control circuit 250 may be hardware, firmware, software, or a plurality of the combination of the foregoing three. In terms of hardware, the block of the aforementioned control circuit 250 may be implemented in a logical circuit of an integrated circuit. The related function of the aforementioned control circuit 250 may be implemented as hardware by using hardware description languages, for example, Verilog HDL or VHDL, or other suitable programming languages. For example, the related functions of the above control circuit 250 may be implemented in one or more controllers, microcontrollers, microprocessors, application-specific integrated circuits (ASICs), digital signal processors (DSPs), field programmable gate arrays (FPGA) and/or various logic blocks, modules, and circuits in other processing units.

Figure 7:
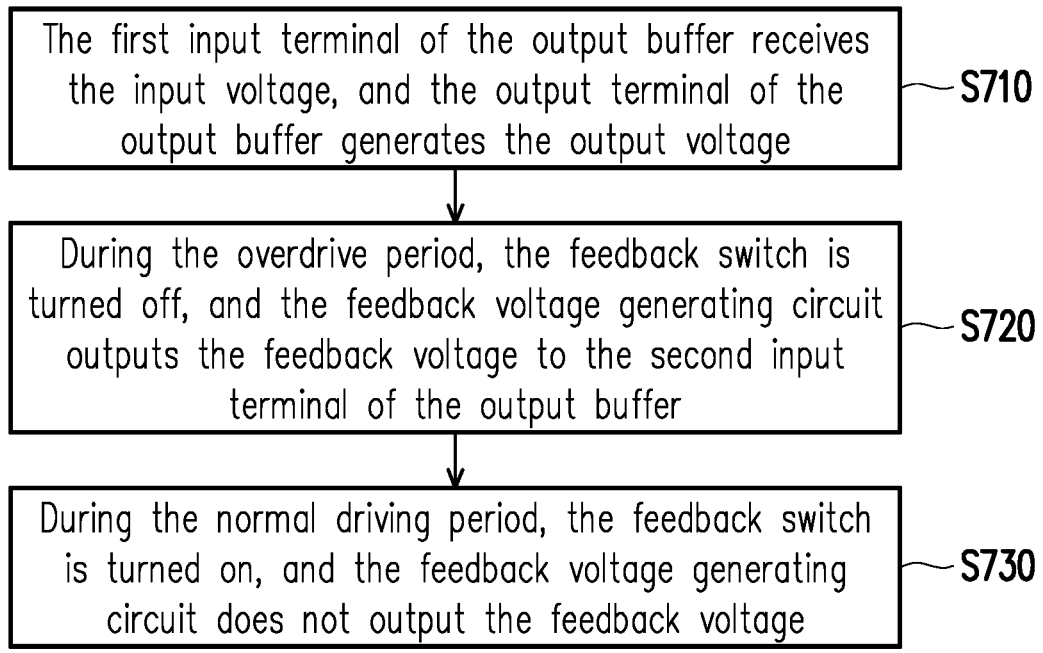
FIG. 7 is a schematic flow chart of an operation method of a source driver according to an embodiment of the invention.

FIG. 7 is a schematic flow chart of an operation method of a source driver according to an embodiment of the invention. In step S710, the first input terminal of the output buffer 230 receives the input voltage Vi, and the output terminal of the output buffer 230 generates the output voltage Vo to the data line of the display panel 130. In step S720, the feedback switch SW1 is turned off during the overdrive period, and the feedback voltage generating circuit 240 generates and outputs the feedback voltage Vfb related to the output voltage Vo to the second input terminal of the output buffer 230. When the input voltage Vi is in the rising mode, the feedback voltage Vfb is lower than the output voltage Vo. In addition, when the input voltage Vi is in the falling mode, the feedback voltage Vfb is higher than the output voltage Vo. After the end of the overdrive period, enters the normal driving period. In step S730, the feedback switch SW1 is turned on during the normal driving period, and the feedback voltage generating circuit 240 does not output the feedback voltage Vfb to the second input terminal of the output buffer 230.

In some embodiments, refer to FIG. 2 and FIG. 7, the operation method further includes: converting the current pixel data Pc to the input voltage Vi by the DAC 222; and outputting the input voltage Vi to the first input terminal of the output buffer 230 by the DAC 222. "The input voltage Vi is in the rising mode" is defined as "the input voltage Vi corresponding to the current pixel data Pc is greater than the input voltage Vi corresponding to the prior pixel data Pp", and "the input voltage Vi is in a falling mode" is defined as "the input voltage Vi corresponding to the current pixel data Pc is smaller than the input voltage Vi corresponding to the prior pixel data Pp".

In some embodiments, the data line is coupled to the near pixel circuit of the display panel (for example, a control circuit P(1,1)) and the far pixel circuit (for example, a control circuit P(1,n)). The distance from the near pixel circuit to the source driver 120 is smaller than the distance from the far pixel circuit to the source driver 120. The overdrive period related to the near pixel circuit is smaller than the overdrive period related to the far pixel circuit.

In some embodiments, refer to FIG. 1 and FIG. 7, the following are further included in the operation method. The switch SW2 is turned on during the overdrive period, where the first terminal of the switch SW2 is coupled to the output terminal of the output buffer 230, and the second terminal of the switch SW2 is coupled to the first terminal of the voltage-dividing resistor R1. The switch SW3 is turned on during the overdrive period, where the first terminal of the switch SW3 is coupled to the second input terminal of the output buffer 230, and the second terminal of the switch SW3 is coupled to the second terminal of the voltage-dividing resistor R1 and the resistance circuit 241. The switch SW2 and the switch SW3 are turned off during the normal driving period.

In some embodiments, refer to FIG. 3 and FIG. 7, the following are further included in the operation method. The switch SW4 is turned on when the input voltage is in the rising mode, where the first terminal of the voltage-dividing resistor R2 is coupled to the second terminal of the voltage-dividing resistor R1. The first terminal of the switch SW4 is coupled to the second terminal of the voltage-dividing resistor R2, the second terminal of the switch SW4 is coupled to the reference voltage VSSA, and the reference voltage VSSA is lower than the output voltage Vo. When the input voltage Vi is in the rising mode, the switch SW5 is turned off, where the first terminal of the switch SW5 is coupled to the second terminal of the voltage-dividing resistor R1, the second terminal of the switch SW5 is coupled to the system voltage VDDA, the system voltage VDDA is higher than the output voltage Vo. When the input voltage Vi is in the falling mode, the switch SW4 is turned off, and the switch SW5 is turned on.

In some embodiments, refer to FIG. 4 and FIG. 7, the following are further included in the operation method. The switch SW4 is turned on when the input voltage Vi is in the rising mode, where the first terminal of the switch SW4 is coupled to the second terminal of the voltage-dividing resistor R1, the second terminal of the switch SW4 is coupled to the first terminal of the voltage-dividing resistor R3, the second terminal of the voltage-dividing resistor R3 is coupled to the reference voltage VSSA, and the reference voltage VSSA is lower than the output voltage Vo. When the input voltage Vi is in the rising mode, the switch SW5 is turned off, where the first terminal of the switch SW5 is coupled to the second terminal of the voltage-dividing resistor R1, the second terminal of the switch SW5 is coupled to the first terminal of the voltage-dividing resistor R4, the second terminal of the voltage-dividing resistor R4 is coupled to the system voltage VDDA, and the system voltage VDDA is higher than the output voltage Vo. When the input voltage Vi is in the falling mode, the switch SW4 is turned off, and the switch SW5 is turned on.

In some embodiments, refer to FIG. 5 and FIG. 7, the following are further included in the operation method. The prior pixel data Pp is converted to the prior voltage Vp, and the prior voltage Vp is output to the second terminal of the voltage-dividing resistor R2 by the digital to analog circuit 510, where the first terminal of the voltage-dividing resistor R2 is coupled to the second terminal of the voltage-dividing resistor R1.

In some embodiments, refer to FIG. 5 and FIG. 7, the following are further included in the operation method. The prior pixel data Pp is received by the output terminal of the DAC 511, where the input terminal of the unity-gain buffer 512 is coupled to the output terminal of the DAC 511, and the prior voltage Vp is supplied to the second terminal of the voltage-dividing resistor R2 by the output terminal of the unity-gain buffer 512.

In some embodiments, refer to FIG. 6 and FIG. 7, the following are further included in the operation method. The switch SW4 is turned on when the input voltage Vi is in the rising mode, where the first terminal of the switch SW4 is coupled to the second terminal of the voltage-dividing resistor R1, and the second terminal of the switch SW4 is coupled to the first terminal of the voltage-dividing resistor R3. The switch SW5 is turned off when the input voltage Vi is in the rising mode, where the first terminal of the switch SW5 is coupled to the second terminal of the voltage-dividing resistor R1. The switch SW4 is turned off when the input voltage Vi is in the falling mode. The switch SW5 is turned on when the input voltage Vi is in the falling mode. The prior pixel data Pp is converted to the prior voltage Vp by the digital to analog circuit 510, and the prior voltage Vp is output to the second terminal of voltage-dividing resistor R3 and the second terminal of the voltage-dividing resistor R4 by the digital to analog circuit 510.

In summary of the above, the source driver 120 and the operation method thereof of the embodiments of the present invention may be selectively altered the feedback voltage of the output buffer 230. The overdrive period and the normal driving period may be included in a period of driving the pixel. The source driver 120 may increase (or decrease) the feedback voltage of the output buffer 230 during the overdrive period. Therefore, the output buffer 230 may selectively overdrive the data line of the display panel 130 to enhance the slew rate of the output voltage Vo.

It will be apparent to those skilled in the art that various modifications and variations can be made to the disclosed embodiments without departing from the scope or spirit of the invention. In view of the foregoing, it is intended that the invention covers modifications and variations of this invention provided that they fall within the scope of the following claims and their equivalents.

What is claimed is:

1. A source driver, comprising:
    an output buffer, having a first input terminal to receive an input voltage, wherein an output terminal of the output buffer is configured to generate an output voltage to a data line of a display panel;
    a feedback switch, having a first terminal and a second terminal respectively coupled to a second input terminal of the output buffer and the output terminal of the output buffer, wherein the feedback switch is turned off during an overdrive period, and the feedback switch is turned on during a normal driving period; and
    a feedback voltage generating circuit, configured to generate and output a feedback voltage related to the output voltage to the second input terminal of the output buffer during the overdrive period, wherein the feedback voltage is not output to the second input terminal of the output buffer during the normal driving period, the feedback voltage is lower than the output voltage when the input voltage is in a rising mode, and the feedback voltage is higher than the output voltage when the input voltage is in a falling mode.

2. The source driver as claimed in claim 1, further comprising:
    a digital to analog converter, coupled to the first input terminal of the output buffer, configured to convert a current pixel data to the input voltage, and output the input voltage to the first input terminal of the output buffer;
    wherein "the input voltage is in the rising mode" is defined as "the input voltage corresponding to the current pixel data is greater than the input voltage corresponding to a prior pixel data", and "the input voltage is in the falling mode" is defined as "the input voltage corresponding to the current pixel data is smaller than the input voltage corresponding to the prior pixel data".

3. The source driver as claimed in claim 1, wherein the data line is coupled to a near pixel circuit and a far pixel circuit of the display panel, the distance from the near pixel circuit to the source driver is smaller than the distance from the far pixel circuit to the source driver, and the overdrive period related to the near pixel circuit is smaller than the overdrive period related to the far pixel circuit.

4. The source driver as claimed in claim 1, wherein the feedback voltage generating circuit comprises:
    a first switch, having a first terminal coupled to the output terminal of the output buffer, wherein the first switch is turned on during the overdrive period and the first switch is turned off during the normal driving period;
    a second switch, having a first terminal coupled to the second input terminal of the output buffer, wherein the second switch is turned on during the overdrive period, and the second switch is turned off during the normal driving period;
    a first voltage-dividing resistor, having a first terminal coupled to a second terminal of the first switch, wherein a second terminal of the first voltage-dividing resistor is coupled to a second terminal of the second switch; and
    a resistance circuit, coupled to the second terminal of the first voltage-dividing resistor.

5. The source driver as claimed in claim 4, wherein the resistance circuit comprises:
    a second voltage-dividing resistor, having a first terminal coupled to the second terminal of the first voltage-dividing resistor;
    a third switch, having a first terminal coupled to a second terminal of the second voltage-dividing resistor, wherein a second terminal of the third switch is coupled to a reference voltage, the reference voltage is lower than the output voltage, the third switch is turned on when the input voltage is in the rising mode, and the third switch is turned off when the input voltage is in the falling mode; and
    a fourth switch, having a first terminal coupled to the second terminal of the second voltage-dividing resistor, wherein a second terminal of the fourth switch is coupled to a system voltage, the system voltage is higher than the output voltage, the fourth switch is turned off when the input voltage is in the rising mode, and the fourth switch is turned on when the input voltage is in the falling mode.

6. The source driver as claimed in claim 4, wherein the resistance circuit comprises:
    a third switch, having a first terminal coupled to the second terminal of the first voltage-dividing resistor, wherein the third switch is turned on when the input voltage is in the rising mode, and the third switch is turned off when the input voltage is in the falling mode;
    a second voltage-dividing resistor, having a first terminal coupled to a second terminal of the third switch, wherein a second terminal of the second voltage-dividing resistor is coupled to a reference voltage, and the reference voltage is lower than the output voltage;
    a fourth switch, having a first terminal coupled to the second terminal of the first voltage-dividing resistor, wherein the fourth switch is turned off when the input voltage is in the rising mode, and the fourth switch is turned on when the input voltage is in the falling mode; and
    a third voltage-dividing resistor, having a first terminal coupled to a second terminal of the fourth switch, wherein a second terminal of the third voltage-dividing resistor is coupled to a system voltage, and the system voltage is higher than the output voltage.

7. The source driver as claimed in claim 4, wherein the resistance circuit comprises:
  a second voltage-dividing resistor, having a first terminal coupled to the second terminal of the first voltage-dividing resistor; and
  a digital to analog circuit, having an output terminal coupled to a second terminal of the second voltage-dividing resistor, configured to convert a prior pixel data to a prior voltage, and output the prior voltage to the second terminal of the second voltage-dividing resistor.

8. The source driver as claimed in claim 7, wherein the digital to analog circuit comprises:
  a digital to analog converter, having an input terminal configured to receive the prior pixel data; and
  a unity-gain buffer, having an input terminal coupled to an output terminal of the digital to analog converter, wherein an output terminal of the unity-gain buffer is coupled to the second terminal of the second voltage-dividing resistor to supply the prior voltage.

9. The source driver as claimed in claim 4, wherein the resistance circuit comprises:
  a third switch, having a first terminal coupled to the second terminal of the first voltage-dividing resistor, wherein the third switch is turned on when the input voltage is in the rising mode, and the third switch is turned off when the input voltage is in the falling mode;
  a second voltage-dividing resistor, having a first terminal coupled to a second terminal of the third switch;
  a fourth switch, having a first terminal coupled to the second terminal of the first voltage-dividing resistor, wherein the fourth switch is turned off when the input voltage is in the rising mode, and the fourth switch is turned on when the input voltage is in the falling mode;
  a third voltage-dividing resistor, having a first terminal coupled to a second terminal of the fourth switch; and
  a digital to analog circuit, having an output terminal coupled to a second terminal of the second voltage-dividing resistor and a second terminal of the third voltage-dividing resistor, configured to convert a prior pixel data to a prior voltage, and output the prior voltage to the second terminal of the second voltage-dividing resistor and the second terminal of the third voltage-dividing resistor.

10. The source driver as claimed in claim 1, wherein the output buffer comprises an operational amplifier.

11. An operation method of a source driver, comprising:
  receiving an input voltage by a first input terminal of an output buffer, and generating an output voltage to a data line of a display panel from an output terminal of the output buffer;
  turning off a feedback switch during an overdrive period, wherein a first terminal and a second terminal of the feedback switch are respectively coupled to a second input terminal of the output buffer and the output terminal of the output buffer;
  generating and outputting a feedback voltage related to the output voltage from a feedback voltage generating circuit to the second input terminal of the output buffer during the overdrive period, wherein the feedback voltage is lower than the output voltage when the input voltage is in a rising mode, and the feedback voltage is higher than the output voltage when the input voltage is in a falling mode;
  turning on the feedback switch during a normal driving period; and
  not outputting the feedback voltage to the second input terminal of the output buffer from the feedback voltage generating circuit during the normal driving period.

12. The operation method as claimed in claim 11, further comprising:
  converting a current pixel data to the input voltage by a digital to analog converter; and
  outputting the input voltage to the first input terminal of the output buffer by the digital to analog converter;
  wherein "the input voltage is in the rising mode" is defined as "the input voltage corresponding to the current pixel data is greater than the input voltage corresponding to a prior pixel data", and "the input voltage is in the falling mode" is defined as "the input voltage corresponding to the current pixel data is smaller than the input voltage corresponding to the prior pixel data".

13. The operation method as claimed in claim 11, wherein the data line is coupled to a near pixel circuit and a far pixel circuit of the display panel, the distance from the near pixel circuit to the source driver is smaller than the distance from the far pixel circuit to the source driver, and the overdrive period related to the near pixel circuit is smaller than the overdrive period related to the far pixel circuit.

14. The operation method as claimed in claim 11, further comprising:
  turning on a first switch during the overdrive period, wherein a first terminal of the first switch is coupled to the output terminal of the output buffer, and a second terminal of the first switch is coupled to a first terminal of a first voltage-dividing resistor;
  turning on a second switch during the overdrive period, wherein a first terminal of the second switch is coupled to the second input terminal of the output buffer, and a second terminal of the second switch is coupled to a second terminal of a first voltage-dividing resistor and a resistance circuit;
  turning off the first switch during the normal driving period; and
  turning off the second switch during the normal driving period.

15. The operation method as claimed in claim 14, further comprising:
  turning on a third switch when the input voltage is in the rising mode, wherein a first terminal of a second voltage-dividing resistor is coupled to the second terminal of the first voltage-dividing resistor, a first terminal of the third switch is coupled to a second terminal of the second voltage-dividing resistor, a second terminal of the third switch is coupled to a reference voltage, and the reference voltage is lower than the output voltage;
  turning off a fourth switch when the input voltage is in the rising mode, wherein a first terminal of the fourth switch is coupled to the second terminal of the second voltage-dividing resistor, a second terminal of the fourth switch is coupled to a system voltage, and the system voltage is higher than the output voltage;
  turning off the third switch when the input voltage is in the falling mode; and
  turning on the fourth switch when the input voltage is in the falling mode.

16. The operation method as claimed in claim 14, further comprising:
- turning on a third switch when the input voltage is in the rising mode, wherein a first terminal of the third switch is coupled to the second terminal of the first voltage-dividing resistor, a second terminal of the third switch is coupled to a first terminal of a second voltage-dividing resistor, a second terminal of the second voltage-dividing resistor is coupled to a reference voltage, and the reference voltage is lower than the output voltage;
- turning off a fourth switch when the input voltage is in the rising mode, wherein a first terminal of the fourth switch is coupled to the second terminal of the first voltage-dividing resistor, a second terminal of the fourth switch is coupled to a first terminal of a third voltage-dividing resistor, a second terminal of the third voltage-dividing resistor is coupled to a system voltage, and the system voltage is higher than the output voltage;
- turning off the third switch when the input voltage is in the falling mode; and
- turning on the fourth switch when the input voltage is in the falling mode.

17. The operation method as claimed in claim 14, further comprising:
- converting a prior pixel data to a prior voltage by a digital to analog circuit; and
- outputting the prior voltage to a second terminal of a second voltage-dividing resistor by the digital to analog circuit, wherein a first terminal of the second voltage-dividing resistor is coupled to the second terminal of the first voltage-dividing resistor.

18. The operation method as claimed in claim 17, further comprising:
- receiving the prior pixel data by an output terminal of a digital to analog converter, wherein an output terminal of a unity-gain buffer is coupled to an output terminal of the digital to analog converter; and
- supplying the prior voltage to the second terminal of the second voltage-dividing resistor by an output terminal of the unity-gain buffer.

19. The operation method as claimed in claim 14, further comprising:
- turning on a third switch when the input voltage is in the rising mode, wherein a first terminal of the third switch is coupled to the second terminal of the first voltage-dividing resistor, and a second terminal of the third switch is coupled to a first terminal of a second voltage-dividing resistor;
- turning off a fourth switch when the input voltage is in the rising mode, wherein a first terminal of the fourth switch is coupled to the second terminal of the first voltage-dividing resistor, and a second terminal of the fourth switch is coupled to a first terminal of a third voltage-dividing resistor;
- turning off the third switch when the input voltage is in the falling mode;
- turning on the fourth switch when the input voltage is in the falling mode;
- converting a prior pixel data to a prior voltage by a digital to analog circuit; and
- outputting the prior voltage to a second terminal of the second voltage-dividing resistor and a second terminal of the third voltage-dividing resistor by the digital to analog circuit.

* * * * *